United States Patent
Bradley et al.

(10) Patent No.: US 7,890,787 B2
(45) Date of Patent: Feb. 15, 2011

(54) MICROPROCESSOR PROGRAMMABLE CLOCK CALIBRATION SYSTEM AND METHOD

(75) Inventors: Shaun Bradley, Murroe (IE); Kieran Heffernan, Patrickswell (IE); Tomas Tansley, Fenit (IE); Yang Ling, Beijing (CN)

(73) Assignee: Analog Devices, Inc., Norwood, MA (US)

( * ) Notice: Subject to any disclaimer, the term of this patent is extended or adjusted under 35 U.S.C. 154(b) by 545 days.

(21) Appl. No.: 11/453,684

(22) Filed: Jun. 15, 2006

(65) Prior Publication Data

US 2007/0019770 A1    Jan. 25, 2007

Related U.S. Application Data

(60) Provisional application No. 60/691,478, filed on Jun. 17, 2005.

(51) Int. Cl.
 *G06F 1/12* (2006.01)
(52) U.S. Cl. .................. 713/500; 713/400; 713/401; 713/501; 713/502; 713/503; 331/2; 331/18; 702/89
(58) Field of Classification Search .............. 331/2, 331/18; 702/89; 713/500, 400, 401, 501, 713/502, 503
See application file for complete search history.

(56) References Cited

U.S. PATENT DOCUMENTS

| | | | |
|---|---|---|---|
| 5,943,613 A * | 8/1999 | Wendelrup et al. | 455/343.1 |
| 6,121,810 A | 9/2000 | Phil Pott | |
| 6,124,764 A * | 9/2000 | Haartsen et al. | 331/111 |
| 6,404,246 B1 * | 6/2002 | Estakhri et al. | 327/156 |
| 6,522,983 B1 * | 2/2003 | Dobos et al. | 702/89 |
| 6,725,067 B1 * | 4/2004 | Marx et al. | 455/574 |
| 6,885,254 B2 * | 4/2005 | Kranz | 331/74 |
| 7,171,576 B2 * | 1/2007 | McDevitt et al. | 713/501 |
| 2003/0095008 A1 * | 5/2003 | Kranz | 331/18 |
| 2005/0221870 A1 * | 10/2005 | Erdelyi et al. | 455/574 |
| 2005/0254610 A1 | 11/2005 | Liu et al. | |
| 2005/0270108 A1 * | 12/2005 | Wilson et al. | 331/2 |
| 2006/0122799 A1 * | 6/2006 | Chen et al. | 702/89 |

* cited by examiner

*Primary Examiner*—Thomas Lee
*Assistant Examiner*—Fahmida Rahman
(74) *Attorney, Agent, or Firm*—Kenyon & Kenyon LLP

(57) ABSTRACT

A microprocessor programmable clock calibration device compares, in response to a calibration command from a programmable processor, turns on a normally off reference oscillator clock, compares the frequency of the reference oscillator clock with the frequency of a calibratable oscillator clock, turns off the reference oscillator clock and adjusts, in response to a difference in those frequencies, the frequency of the calibratable oscillator clock towards that of the reference oscillator clock.

25 Claims, 4 Drawing Sheets

MICROPROCESSOR PROGRAMMABLE CLOCK CALIBRATION SYSTEM AND METHOD

RELATED APPLICATIONS

This application claims benefit of and priority to U.S. Provisional Application Ser. No. 60/691,478 filed Jun. 17, 2005 incorporated herein by this reference.

FIELD OF THE INVENTION

This invention relates to a microprocessor clock calibration system and method.

BACKGROUND OF THE INVENTION

Microprocessor systems require highly accurate oscillation clocks especially in communication applications. High accuracy oscillation clocks come with a certain cost. They require external components including e.g., resistors, capacitors, crystal oscillators and require significant power. High accuracy oscillator clocks on sub-micron CMOS have high power budgets and are prone to electronic noise and EMI generation: the high current needs of high accuracy oscillator clocks in sub-micron CMOS causes electrical noise and driving clock signals to external pins radiates EMI. CMOS based oscillator clocks with better than 3% accuracy have high power consumption especially at lower geometries e.g. 0.25μ and external crystals running continuously can cause electrical noise and EMI. One attempt to address this problem includes using a reference signal and a calibration reference to generate the desired oscillator clock. Another attempt uses an oscillator clock of much higher frequency than required e.g., 500× with the higher frequency oscillator clock correcting only for one period of the lower frequency oscillator clock. Recalibration is set by a given number of clocks of the lower frequency oscillator clock. While both approaches are useful there are still shortcomings.

SUMMARY OF THE INVENTION

It is therefore an object of this invention to provide an improved microprocessor method and system with programmable clock calibration It is a further object of this invention to provide such an improved microprocessor method and system with programmable clock calibration in which the reference oscillator clock can be disabled except for periodic calibration operations.

It is a further object of this invention to provide such an improved microprocessor method and system with programmable clock calibration which enables high clock accuracy with low power.

It is a further object of this invention to provide such an improved microprocessor method and system with programmable clock calibration which reduces noise and EMI because the higher accuracy, higher power reference oscillator clock runs for only limited periods of time.

It is a further object of this invention to provide such an improved microprocessor method and system with programmable clock calibration which enables a low accuracy clock to be used in high accuracy applications.

The invention results from the realization that an improved highly versatile low power, high accuracy clock system and method for a microprocessor system can be achieved with a programmable clock calibration wherein periodically, a calibration command from a programmable processor triggers a calibration operation wherein a high power, high accuracy reference oscillator clock is enabled for only a limited time during which its output frequency is compared to that of a low accuracy, low power calibratable clock and any difference is used to adjust the calibratable oscillator clock frequency toward that of the reference oscillator clock and the programmable processor can be programmed to generate the calibration command based on any one of a number of parameters, e.g. time, temperature, voltage, current . . .

The subject invention, however, in other embodiments, need not achieve all these objectives and the claims hereof should not be limited to structures or methods capable of achieving these objectives.

This invention features a microprocessor programmable clock calibration system including a normally off reference oscillator clock and a normally on calibratable oscillator clock. There is a programmable processor for providing a calibration command which turns on the reference oscillator clock and a calibration control system which responds to the calibration command for comparing the frequencies of the clocks. The processor turns off the reference oscillator clock after the frequencies are compared. A trim circuit responds to a difference in the clock frequencies to adjust the calibratable clock towards the reference clock.

In a preferred embodiment the reference oscillator clock may be a higher accuracy, higher power clock and the calibratable oscillator clock may be a lower accuracy, lower power clock. A calibration control system may include a configuration register for receiving the calibration command. The calibration control system may include a reference clock counter circuit, a calibratable clock counter circuit, and a control circuit including a state machine for enabling both the counter circuits to count their respective oscillator clock outputs for a predetermined interval and compare those outputs. The predetermined interval may be defined as the full count of the reference clock counter circuit. The trim circuit may include a trim register. The trim circuit may be programmable. The programmable processor may include a sensor system for monitoring a predetermined parameter and generating a calibration command in response to a change in that parameter. The parameters may include at least one of time, temperature, voltage, current. The trim circuit may be driven by the processor in response to a difference in the clock frequencies to adjust the calibratable oscillator clock and the calibration control circuit may include a state machine with states of idle, enable, count, and finish. The trim circuit may be driven by the calibration control circuit and the calibration control circuit may include a state machine with states of idle, reset calibration logic, enable calibration, busy go low, comparison of oscillator clock frequencies and adjust calibratable oscillator clock frequency.

This invention also features a microprocessor programmable clock calibration method including comparing, in response to a calibration command from a programmable processor, turning on a normally off reference oscillator clock, comparing the frequency of a reference oscillator clock to the frequency of a calibratable oscillator clock, adjusting, in response to a difference in those frequencies, the frequency of the calibratable oscillator clock toward that of the reference oscillator clock, and turning off the reference oscillator clock.

In a preferred embodiment the reference oscillator clock may be a higher accuracy, higher power clock and the calibratable oscillator clock may be lower accuracy, lower power clock. Each oscillator clock output may be counted for a predetermined interval and the counts compared. The interval may be defined as the full count derived from the reference oscillator clock output. The calibration command may be generated by the programmable processor in response to a change in a programmable parameter. The frequency of the calibratable oscillator clock may be adjusted by the processor.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
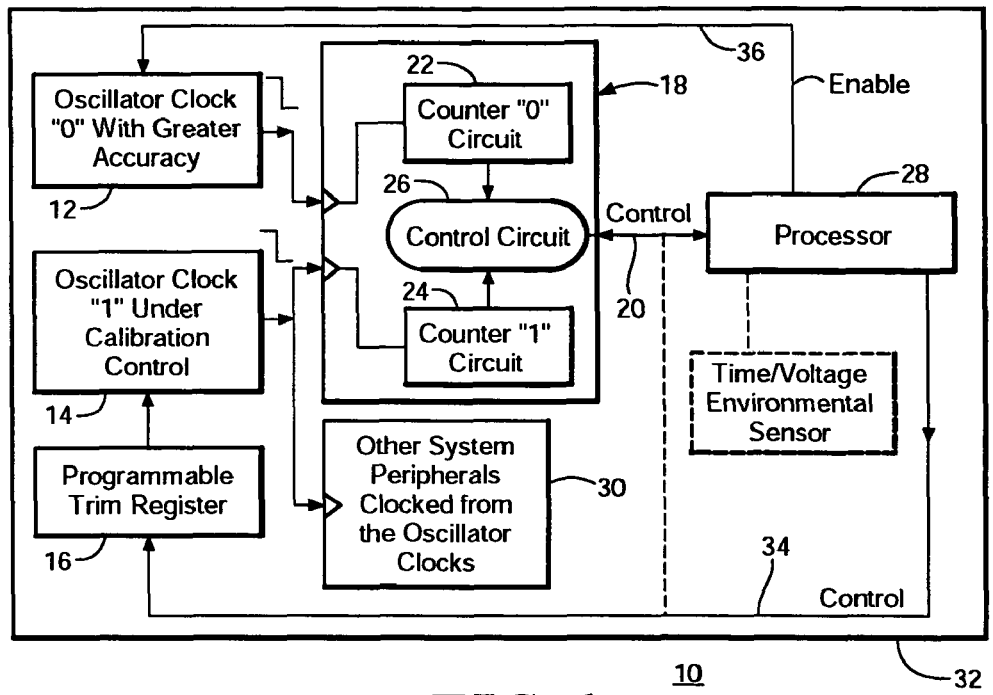
FIG. 1 is a schematic block diagram of one embodiment of a microprocessor system with programmable clock calibration according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

One embodiment of a microprocessor programmable clock calibration system 10 is shown in FIG. 1 as including a higher accuracy, higher power, oscillator "0", 12 and a lower power, lower accuracy oscillator clock "1", 14 which is calibratable. The frequency of clock 14 is controlled by programmable trim register 16. Calibration control system 18 senses any difference in the output frequencies of oscillator clocks 12 and 14 and provides a signal on line 20 indicating that difference. Calibration control system 18 includes counter "0" circuit 22 responsive to oscillator clock "0", 12 and counter "1" circuit 24 responsive to oscillator clock "1" 14. Also included in calibration control system 18 is control circuit 26. Line 20 is a bi-directional line which provides communications in both directions between calibration control system 18 and processor 28. All of these components so far referred to, as well as, other system peripherals 30, clocked from the oscillator clocks may all be contained on a single integrated circuit chip 32.

In operation, the higher accuracy, higher power oscillator clock "0", 12 is normally off, while the lower power, lower accuracy oscillator clock "1", 14 is operational and provides a clock for the on board system. Periodically, upon a calibration command, on line 20 from processor 28 to calibration control system 18, counter "0" circuit 22 and counter "1" circuit 24 are simultaneously enabled to begin counting. Control circuit 26 monitors counter "0" circuit 22 and when it has reached a predetermined number it turns off counter "0" circuit 22 and counter "1" circuit 24. Control circuit 26 now compares the counts in counter "0" circuit 22 and counter "1" circuit 24. If the count in counter "1" circuit 24 is higher than that in counter "0" circuit 22 it means that oscillator clock "1", 14 is running faster than the reference clock 12. If the count in counter "1", circuit 24 is less than the count in counter "0", circuit 22 it means that oscillator clock "1", 14 is running slower than the reference oscillator clock "0", 12. The results of this comparison are provided on bi-directional line 20 to processor 28 which then provides the signal on line 34 to enable the programmable trim register 16 to step up or step down the frequency of oscillator clock "1", 14.

Programmable trim register 16 is programmable from processor 28 so that upon receipt of a signal on line 34, it will step up or step down the frequency of oscillator clock "1", 14. Once the comparison has been made by calibration control system 26 oscillator clock "0", 12 the higher power, higher accuracy clock is turned off so that it is on for only limited times when accessed by a calibration command from processor 28. This greatly reduces the power requirements, and noise attendant on such higher power, oscillator clocks. The lower power, lower accuracy clock is on continuously and due to its periodic updating provides a higher accuracy yet at lower power. A signal from processor 28 on line 36 is used to shut down higher accuracy, higher power oscillator clock "0", 12 when it is not being used for calibration purposes. The calibration command from processor 28 can be developed by reference to any condition or parameter. So long as the calibration control system 26 receives the proper calibration command on line 20 it will initiate and complete the calibration operation. That calibration command can be developed in processor 28 by for example, monitoring time, temperature, voltage, current or any other desired parameter, so that upon a change in condition or any of those parameters processor 28 will respond by among other things providing the calibration command on line 20.

Figure 2:
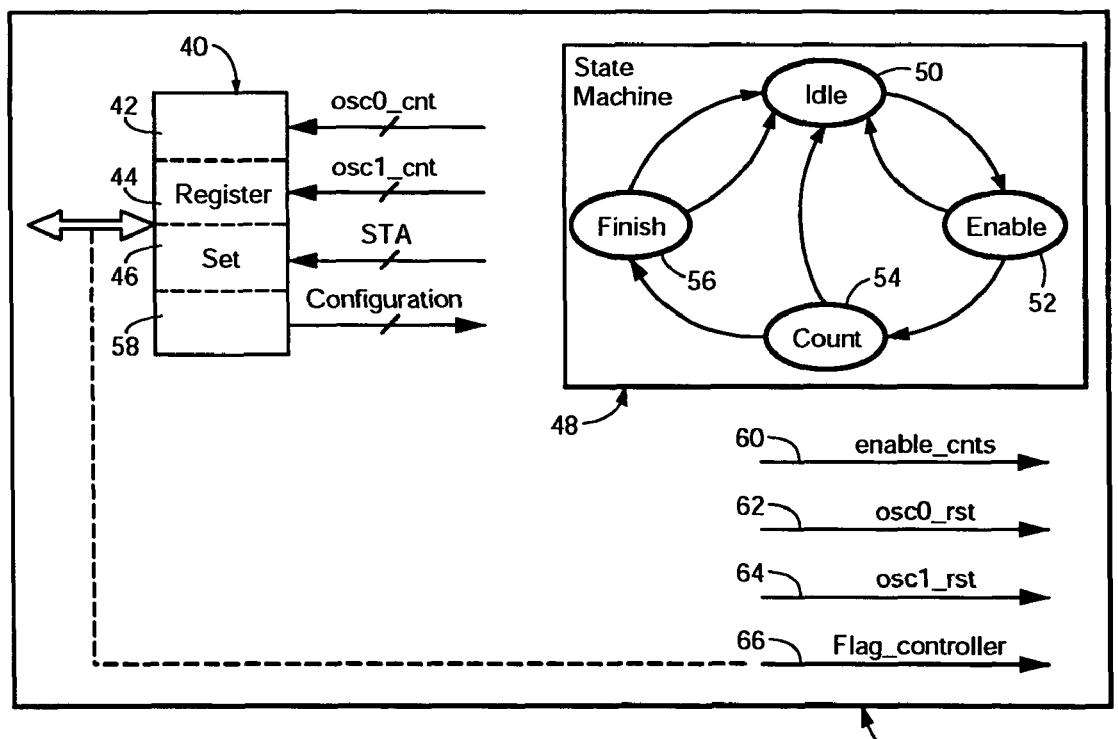
FIG. 2 is a more detailed schematic block diagram of the calibration control system of FIG. 1 including a register set and a state machine.

Control circuit 26 may include register set 40, FIG. 2, in which one register 42 keeps count of the contents of counter "0" circuit 22 during the calibration operation and a second register 44 which keeps count of the count in counter "1" circuit 24 during the calibration operation. A third register 46, the status register, presents the condition of control circuit 26 when it is performing a calibration operation the status is Busy; when the calibration operation is complete, the status is Complete; when the status is Busy, four different states may be represented: Idle, Enable, Count, or Finish. These are the states of state machine 48. Normally state machine 48 resides in the Idle state 50. When a calibration command is received it moves to the Enable state 52 to enable the pertinent parts of calibration control system 18. Then it begins counting in Count state 54; when the counting is done and comparison is complete it moves to the Finish state 56, after which it returns to Idle state 50. The fourth register in register set 40 is the configuration register 58. Register 58 receives the calibration command word and causes four signals to be sent out. The first 60 enables the counters, the next two signals 62 and 64 reset those counters and the fourth signal 66 becomes part of 20 in FIG. 1, used to signal the processor.

Figure 3:
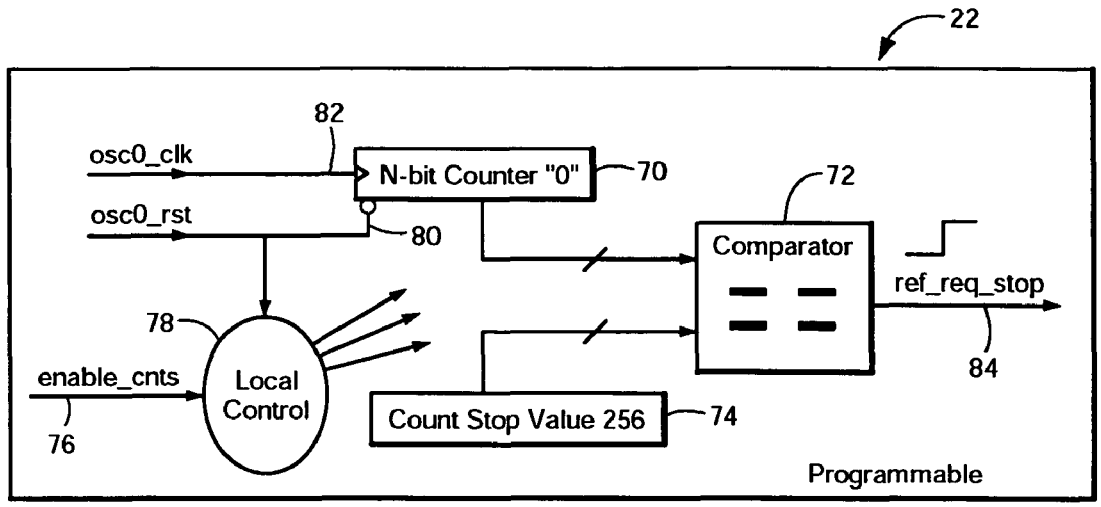
FIG. 3 is more detailed schematic block diagram of the high accuracy counter circuit of FIG. 1.

Counter "0" circuit 22, FIG. 3, may include an N-bit counter 70, for example, an eight-bit counter, a comparator 72 and a register or reference 74 containing a count stop value. For example, for N-bit counters "0", 70 where N is eight and the full count of counter "0", 70 is 255 the count stop value 74 may be 255 as well. When the count stop value is reached, whatever it be, the counting of both counting circuits is stopped. N-bit counter "0", 70, when enabled by an enable counter on line 76, which actuates all the necessary local control circuits 78, and having received a reset signal on line 80, can begin to count the bits, clock pulses, appearing on line 82. This keeps up until N-bit counter "0" 70 reaches the count stop value 74. At this point comparator 72 recognizes the equality and puts outs the stop signal on line 84 to move state machine 48 from Count 54 to Finish 56, FIG. 2. N-bit counter "0" 70 although explained as an eight bit counter can be any size desired and count stop value 74, FIG. 3, may be the full count of which N-bit counter "0" 70 is capable or any lesser number. Counter "1" circuit 24, FIG. 4, includes N+1 bit counter 86. For example, if N-bit counter "0" 70 in FIG. 3, is an eight bit counter then N+1 bit counter "1" 86 in FIG. 4, would be a nine bit counter. This doubles the size of counter 86 with respect to counter 70 and gives a wide tolerance margin: that is the frequency of the calibratable oscillator clock 14, FIG. 1, may be as much as twice that of the reference oscillator clock "0" 12 when N-bit counter "0" 70 is an eight bit counter and count stop value 74 is 255 or the full value of N-bit counter 70. But any other combination of counter or counter arrangements may be used which permits the comparison of the frequencies of the two clocks, oscillator clock "0" 12 and oscillator clock "1" 14.

Figure 4:
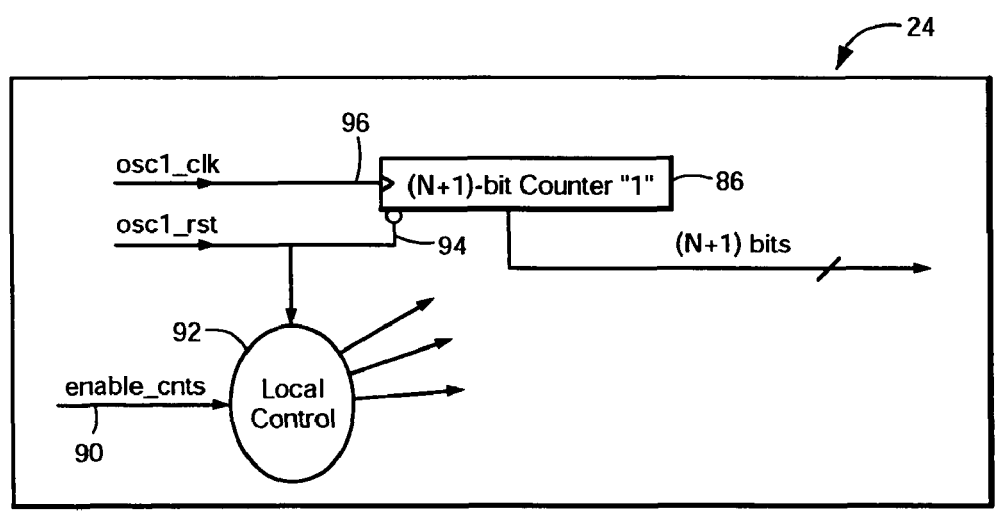
FIG. 4 is more detailed schematic block diagram of the low accuracy counter circuit of FIG. 1.

In operation, N+1 bit counter 86, FIG. 4, receives an enable signal on line 90 which permits local control 92 to enable N+1 bit counter "1" 86 and its attendant circuitry. Upon the occurrence of the enable circuit 90 and the reset signal on line 94 N+1 bit counter "1" 86 begins to count the clock signals on line 96. When the count in N-bit counter "0" 70 reaches count stop value 74 N+1 bit counter "1" 86 will be stopped along with N-bit counter "0" 70.

Figure 5:
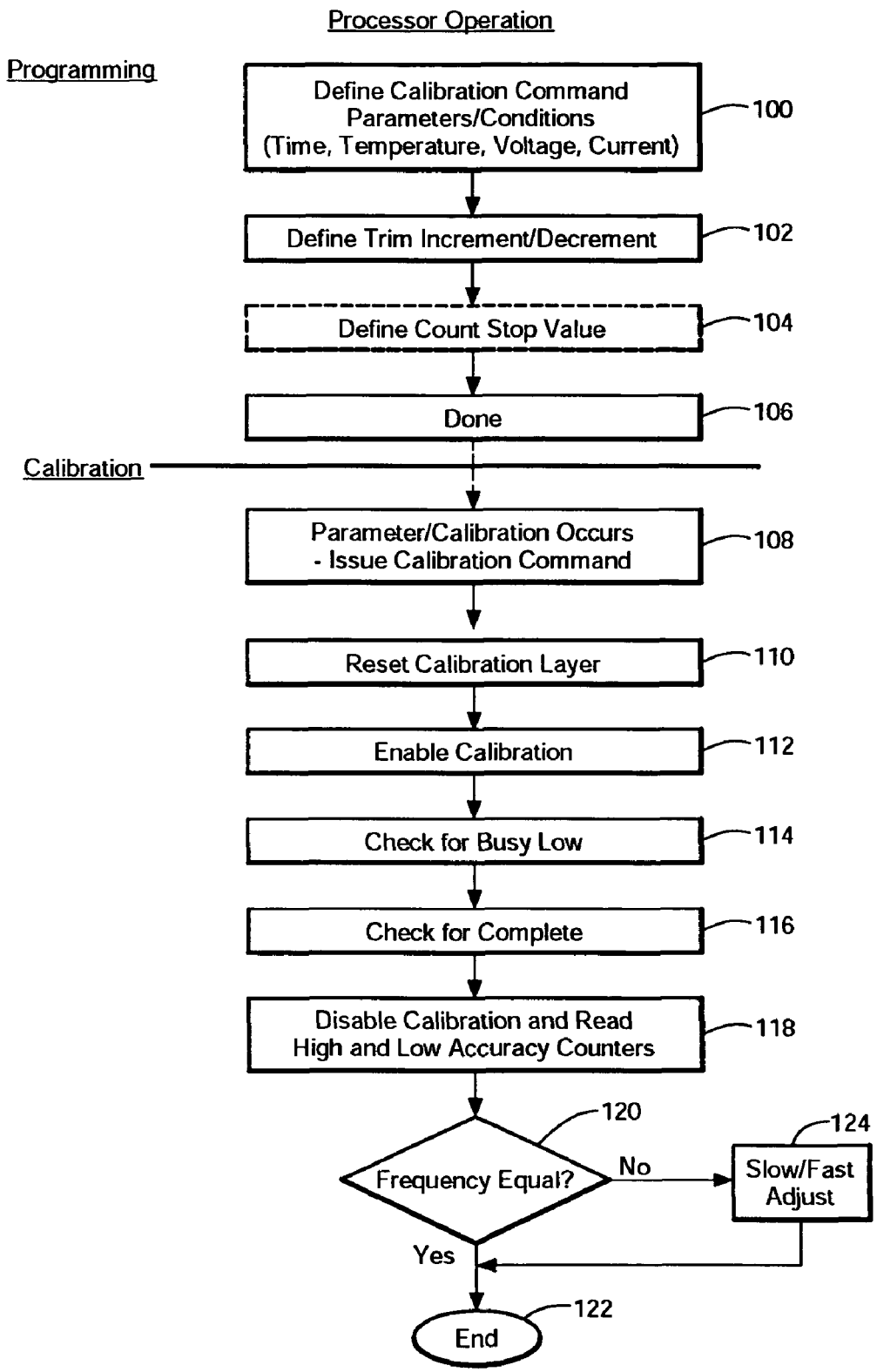
FIG. 5 is a flow chart showing the method of operation of the processor in programming and calibration modes.

The programmability provided by this invention is illustrated in FIG. 5 where a processor operation in a first mode is programmed to define the calibration command parameters/conditions such as time, temperature, voltage, current step 100. The amount of increment or decrement introduced by programmable trim circuit or register 16, FIG. 1, occurs in step 102, this allows the user/programmer to decide how much of a change in either direction will be applied by trim register 16 in the event of a difference in the output frequencies of the two oscillator clocks. Also programmable is the count stop value, step 104. After this the programming is complete, step 106, and the system is ready for a calibration operation. This begins when a parameter/condition occurs, step 108, and a calibration command is issued step 108. When the calibration command is installed in the configuration register 58, FIG. 2, the calibration logic is reset, step 110, FIG. 5, and calibration is enabled, step 112. The system then checks to see whether the Busy signal is low, if it is, in step 114, the system checks to see if the calibration operation is complete, in step 116. If it is the calibration is disabled and the high and low accuracy counters are read, step 118. If the frequencies are determined to be equal in step 120 the calibration operation comes to an end in step 122. If they are not equal the system makes an adjustment to accommodate for slow or fast in step 124 and then continues to the end at step 122.

Figure 6:
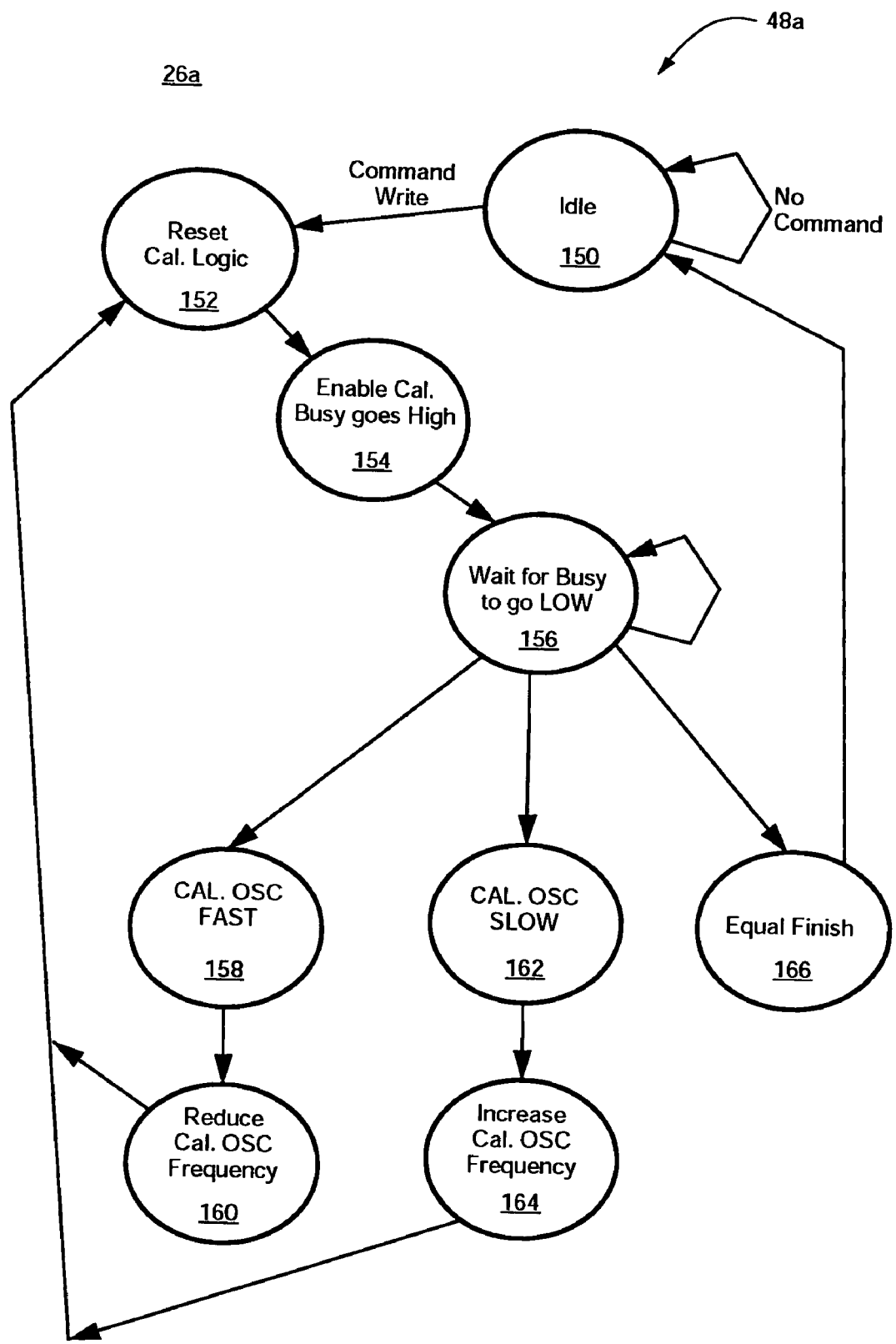
FIG. 6 is a diagram of an alternate state machine to that of FIG. 2 when the calibration controller not the processor supervises the calibration method.

Although thus far processor 28, FIG. 1, not only defines the calibration command parameters and issues the calibration command it also supervises the operation of the calibration operation, this latter part is not necessarily a limitation of the invention. For example, the supervision of the calibration operation may be performed wholly by the control circuit 26a, FIG. 6, when equipped with a state machine 48a whose basic state when there is no command is the Idle state 150. Upon a command being written to configuration register 58, FIG. 2, state machine 48a, FIG. 6, enters the reset calibration logic state 152; it then enables calibration at state 154 where upon Busy goes high and it now enters state 156 where it waits for Busy to go low. When Busy goes low this indicates that the counters have stopped counting and it is time to compare the counts. If the calibration oscillator is fast then the state machine enters state 158 and the calibration oscillator frequency is reduced, state 160. If on the other hand the calibration oscillator is slow then state machine 48a enters state 162 and then in state 164 it increases the calibration reference oscillator frequency. In either case, from state 160 and state 164 state machine returns to the state 152 to reset the calibration logic. If the frequency of the reference oscillator clock and the calibratable oscillator clock are the same state 166 is reached after which the system moves back to Idle state 150.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A microprocessor programmable clock calibration system comprising:
   a normally off reference oscillator clock;
   a normally on calibratable oscillator clock;
   a programmable processor for providing a calibration command which turns on said reference oscillator clock;
   a calibration control system responsive to said calibration command for comparing frequencies of said clocks, said processor turning off said reference oscillator clock after the frequencies are compared, wherein the calibration control system includes a first counter to count the reference oscillator clock and a second counter to count the calibratable oscillator clock and the frequencies of the clocks are compared by comparing the counts of the two counters; and
   a trim circuit responsive to a difference in said clock frequencies for adjusting said calibratable clock towards said reference clock, wherein the trim circuit is driven by the calibration control system and the calibration control system includes a state machine with states of idle, reset calibration logic, enable calibration, wait for counters to stop, compare oscillator clock frequencies and adjust calibratable oscillator clock frequency.

2. The microprocessor programmable clock calibration system of claim 1 in which said reference oscillator clock is a higher accuracy, higher power clock and said calibratable oscillator clock is a lower accuracy, lower power clock.

3. The microprocessor programmable clock calibration system of claim 1 in which said calibration control system includes a configuration register for receiving said calibration command.

4. The microprocessor programmable clock calibration system of claim 3 in which said calibration control system includes a reference clock counter circuit and a calibratable clock counter circuit, and outputs of the state machine enable both said counter circuits to count their respective said oscillator clock outputs for a predetermined interval and to compare said clock outputs.

5. The microprocessor programmable clock calibration system of claim 4 in which said predetermined interval is defined as the full count of said reference clock counter circuit.

6. The microprocessor programmable clock calibration system of claim 1 in which said trim circuit includes a trim register.

7. The microprocessor programmable clock calibration system of claim 6 in which said trim circuit is programmable.

8. The microprocessor programmable clock calibration system of claim 1, further comprising a sensor system for monitoring a predetermined parameter and generating the calibration command in response to a change in said parameter.

9. The microprocessor programmable clock calibration system of claim 8 in which said parameter includes at least one of time, temperature, voltage, current.

10. The microprocessor programmable clock calibration system of claim 1 in which said trim circuit is driven by said processor in response to an output of the state machine.

11. A microprocessor programmable clock calibration method comprising:
    in response to a calibration command, turning on a normally off reference oscillator clock, comparing frequency of the reference oscillator clock to frequency of a calibratable oscillator clock, turning off the reference oscillator clock, wherein a first counter is to count the reference oscillator clock and a second counter is to count the calibratable oscillator clock and the frequencies of the clocks are compared by comparing the counts of the two counters; and
    adjusting, in response to a difference in these frequencies, the frequency of the calibratable oscillator clock toward that of the reference oscillator clock by a trim circuit, wherein the trim circuit is driven by a calibration control system including a state machine with states of idle, reset calibration logic, enable calibration, wait for counters to stop, compare oscillator clock frequencies and adjust calibratable oscillator clock frequency.

12. The microprocessor programmable clock calibration method of claim 11 in which said reference oscillator clock is a higher accuracy, higher power clock and said calibratable oscillator clock is a lower accuracy, lower power clock.

13. The microprocessor programmable clock calibration method of claim 11 in which each of said oscillator clock outputs is counted for a predetermined interval before the counts are compared.

14. The microprocessor programmable clock calibration method of claim 13 in which said interval is defined as the full count derived from said reference oscillator clock output.

15. The microprocessor programmable clock calibration method of claim 11 in which said calibration command is generated by said programmable microprocessor in response to a change in a programmable parameter.

16. The microprocessor programmable clock calibration method of claim 11 in which the frequency of the calibratable oscillator clock is adjusted by said mircoprocessor.

17. A microprocessor programmable clock calibration system comprising:
    a normally off reference oscillator clock;
    a normally on calibratable oscillator clock;
    a programmable processor for providing a calibration command which turns on said reference oscillator clock;
    a calibration control system responsive to said calibration command for comparing frequencies of said clocks, said processor turning off said reference oscillator clock after the frequencies are compared, wherein the calibration control system includes a first counter to count the reference oscillator clock and a second counter to count the calibratable oscillator clock and the frequencies of the clocks are compared by comparing the counts of the two counters; and
    a trim circuit responsive to a difference in said clock frequencies for adjusting said calibratable clock towards said reference clock, wherein the trim circuit is driven by the calibration control system that includes a state machine with states of idle, wait for counters to stop and adjust calibratable oscillator clock frequency.

18. The microprocessor programmable clock calibration system of claim 17, wherein the reference oscillator clock is a higher accuracy, higher power clock and the calibratable oscillator clock is a lower accuracy, lower power clock.

19. The microprocessor programmable clock calibration system of claim 17, wherein the calibration control system includes a configuration register for receiving the calibration command.

20. The microprocessor programmable clock calibration system of claim 19, wherein the calibration control system includes a reference clock counter circuit and a calibratable clock counter circuit, and outputs of the state machine enable both said counter circuits to count their respective oscillator clock outputs for a predetermined interval and to compare the clock outputs.

21. The microprocessor programmable clock calibration system of claim 20, wherein the predetermined interval is defined as the full count of the reference clock counter circuit.

22. The microprocessor programmable clock calibration system of claim 17, wherein the trim circuit includes a programmable trim register.

23. The microprocessor programmable clock calibration system of claim 17, further comprising a sensor system for monitoring a predetermined parameter and generating the calibration command in response to a change in the predetermined parameter, wherein the predetermined parameter includes at least one of time, temperature, voltage, current.

24. The microprocessor programmable clock calibration system of claim 17, wherein the trim circuit is driven by the processor in response to an output of the state machine.

25. The microprocessor programmable clock calibration system of claim 17, wherein the state machine further includes states of reset calibration logic, enable calibration and compare oscillator clock frequencies.

* * * * *